United States Patent [19]
Li

[11] Patent Number: 6,163,458
[45] Date of Patent: Dec. 19, 2000

[54] HEAT SPREADER FOR BALL GRID ARRAY PACKAGE

[75] Inventor: Ji-Ming Li, Taipei, Taiwan

[73] Assignee: Caesar Technology, Inc., Hsinchu, Taiwan

[21] Appl. No.: 09/453,439

[22] Filed: Dec. 3, 1999

[51] Int. Cl.⁷ ........................................ H05K 7/20

[52] U.S. Cl. ................. 361/704; 361/702; 361/707; 361/719; 361/722; 257/706; 257/707; 257/778; 174/16.3

[58] Field of Search ................... 361/702–712, 361/717–722, 723, 735, 772–773, 787, 367, 770, 790, 813, 820; 257/704, 706–727, 738, 778, 780, 697, 666; 174/52.1, 52.2, 16.3, 252; 228/175, 180.5, 180.22; 264/272.14, 272.17; 165/80.3, 80.6, 165, 185

[56] References Cited

U.S. PATENT DOCUMENTS

| | | | |
|---|---|---|---|
| 5,877,552 | 3/1999 | Chiang | 257/706 |
| 5,977,626 | 11/1999 | Wang et al. | 257/707 |

*Primary Examiner*—Leo P. Picard
*Assistant Examiner*—Michael Datskovsky
*Attorney, Agent, or Firm*—Rosenberg, Klein & Lee

[57] ABSTRACT

The present invention proposes a heat spreader for a ball grid array package. In a ball grid array package, a chip is attached to a first surface of a substrate by adhesives. Bonding areas on the first surface of the substrate adjoining to where the chip is attached are connected to the chip through metal leads. Solder balls formed on the first surface of the substrate are soldered to another device such as a motherboard. A metal heat spreader having a protuberance covers on the chip. The protuberance of the heat spreader contacts the chip to enhance the heat dissipating effect of the chip.

5 Claims, 2 Drawing Sheets

HEAT SPREADER FOR BALL GRID ARRAY PACKAGE

FIELD OF THE INVENTION

The present invention relates to a heat spreader for an electronic package, especially to a heat spreader for a ball grid array package.

BACKGROUND OF THE INVENTION

The ball grid array package is the more advanced electronic package type. FIG. 1 shows a chip device of cavity down type. A metal plate is disposed on the back of a substrate a to enhance the heat dissipating effect. A concavity a1 forms on the front surface of the substrate a. A chip c is attached in the concavity a1 by adhesives such as conducting epoxy or silver epoxy. The front surface of the substrate a has bonding areas a2 adjoining to the concavity a1. Metal leads 1 are formed by wire-bonding to connect the bonding areas a2 to bonding pads c1 of the chip c. An encapsulation layer d is formed to sheathe the chip c and the bonding areas a2 of the substrate a. Solder balls a3 on the substrate a are soldered to another device b such as a motherboard.

As the packing density of IC devices increases, their circuit functions become more complex. Using the back surface of the substrate a for heat dissipation of the chip c is not enough. Other means must be adopted to enhance the heat dissipating effect.

SUMMARY AND OBJECTS OF THE INVENTION

The primary object of the present invention is to enhance the heat dissipating effect for the ball grid array package. The present invention uses a metal heat spreader having a protuberance to cover on the chip. The protuberance of the heat spreader contacts the chip to enhance the heat dissipating effect of the chip. When the substrate is processed in a tin furnace to be soldered to another device, tin lumps will infiltrate to the back of the protuberance of the heat spreader. These tin lumps can also enhance he heat dissipating effect.

The various objects and advantages of the present invention will be more readily understood from the following detailed description when read in conjunction with the appended drawing, in which:

DETAILED DESCRIPTION OF PREFERRED EMBODIMENT

Figure 1:
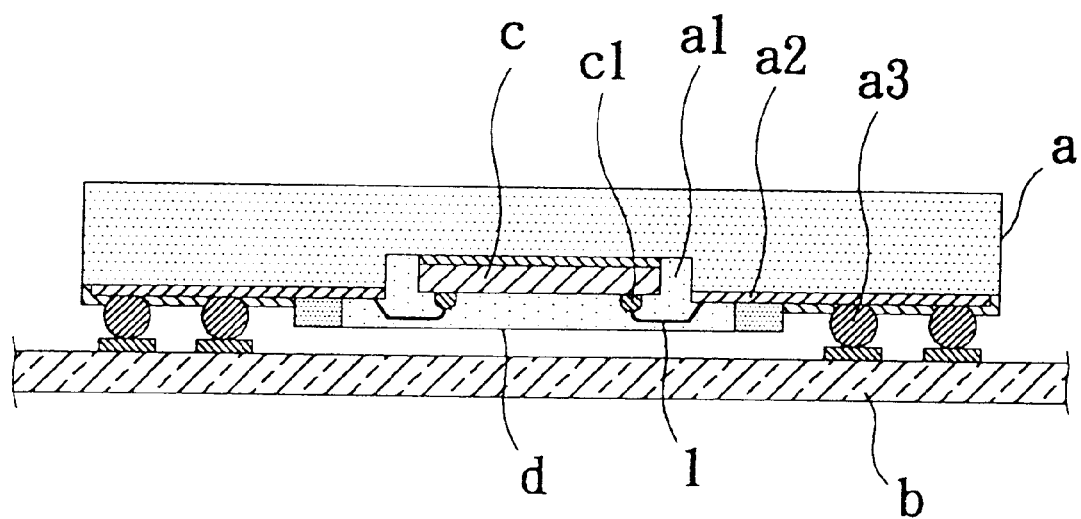
FIG. 1 is a cross-sectional view of a conventional ball grid array packaged device.
Figure 2:
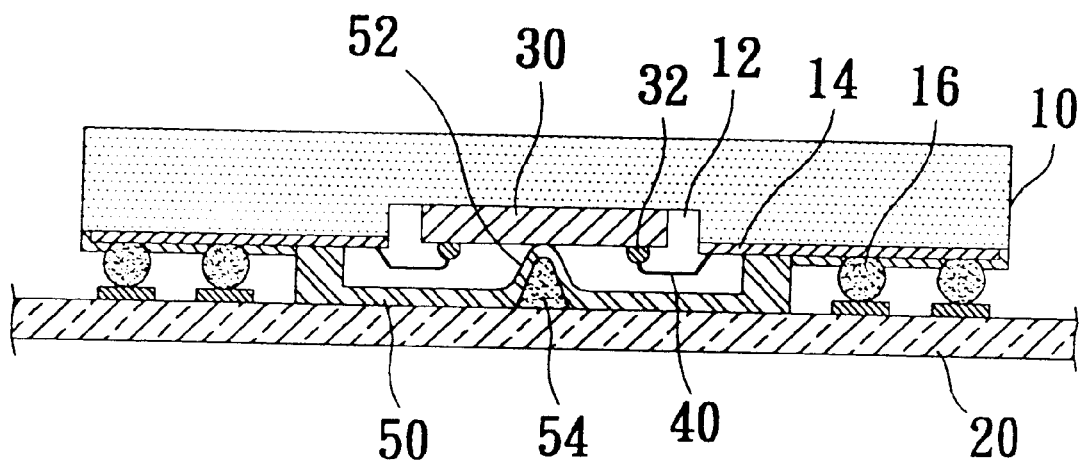
FIG. 2 is a cross-sectional view of a ball grid array packaged device according to an embodiment of the present invention.

FIG. 2 shows a ball grid array packaged device according to an embodiment of the present invention. A chip 30 is attached in a concavity 12 of a substrate 10 by adhesives such as conducting epoxy or silver epoxy. Bonding areas 14 adjoining to the concavity 12 on the front surface of the substrate 10 are connected to bonding pads 32 of the chip 30 through metal leads 40. Solder balls 16 on the substrate 10 are soldered to another device 20 such as a motherboard.

A metal heat spreader 50 having a protuberance 52 covers on the chip 30. The protuberance 52 contacts the chip 30 to enhance the heat dissipating effect of the chip. The thinner protuberance 52 is formed by punch-pressing the heat spreader 50 to contact the chip 30.

When the substrate 10 is processed in a tin furnace to be soldered to another device 20, tin lumps will infiltrate to a concavity 54 on the back of the protuberance 52. These tin lumps can also enhance the heat dissipating effect.

The thickness of the heat spreader 50 is preferably to be within the height of the solder balls 16. The heat spreader 50 also has the protection function for sheathing the chip 30. Another encapsulation layer is thus not needed.

Although the present invention has been described with reference to the preferred embodiment thereof, it will be understood that the invention is not limited to the details thereof. Various substitutions and modifications have suggested in the foregoing description and other will occur to those of ordinary skill in the art. Therefore, all such substitutions and modifications are intended to be embraced within the scope of the invention as defined in the appended claims.

I claim:

1. A heat spreader for a ball grid array package comprising:
    a substrate having two surfaces, solder balls formed on a first surface thereof soldered to another device;
    a chip attached in the cavity formed in said first surface of said substrate by adhesives; and
    a heat spreader covering on said chip, a protuberance formed on said heat spreader contacting said chip.

2. The heat spreader for a ball grid array package of claim 1 wherein tin lumps infiltrate to a concavity on the back of said protuberance.

3. The heat spreader for a ball grid array package of claim 1 wherein the height of said heat spreader is within the height of said solder balls.

4. The heat spreader for a ball grid array package of claim 1 wherein said protuberance is formed by punch-pressing said heat spreader.

5. The heat spreader for a ball grid array package of claim 1 wherein said heat spreader is soldered to another device.

* * * * *